United States Patent [19]

Hanoka

[11] Patent Number: 5,733,382
[45] Date of Patent: Mar. 31, 1998

[54] SOLAR CELL MODULES AND METHOD OF MAKING SAME

[76] Inventor: Jack I. Hanoka, 107 York Ter., Brookline, Mass. 02146

[21] Appl. No.: 574,232

[22] Filed: Dec. 18, 1995

(Under 37 CFR 1.47)

[51] Int. Cl.⁶ .................................................. H01L 31/048
[52] U.S. Cl. ................... 136/251; 437/2; 437/211; 437/219; 257/433; 156/285; 156/286
[58] Field of Search .................... 136/251, 259; 257/433–434; 437/2–5, 207, 211, 219; 156/285–286

[56] References Cited

U.S. PATENT DOCUMENTS

| | | | |
|---|---|---|---|
| 4,170,507 | 10/1979 | Keeling et al. | 156/245 |
| 4,239,555 | 12/1980 | Scharlack et al. | 136/251 |
| 4,249,958 | 2/1981 | Baudin et al. | 136/251 |
| 4,830,038 | 5/1989 | Anderson et al. | 136/251 |
| 5,252,141 | 10/1993 | Inoue et al. | 136/251 |
| 5,460,660 | 10/1995 | Albright et al. | 136/251 |
| 5,476,553 | 12/1995 | Hanoka | 136/251 |
| 5,478,402 | 12/1995 | Hanoka | 136/251 |
| 5,578,142 | 11/1996 | Hattori et al. | 136/251 |

FOREIGN PATENT DOCUMENTS

| | | | |
|---|---|---|---|
| 2832475 | 2/1980 | Germany | 136/251 |
| 58-17685 | 2/1983 | Japan | 136/251 |
| 58-84469 | 5/1983 | Japan | 136/251 |
| 4-101465 | 4/1992 | Japan | 136/251 |

*Primary Examiner*—Aaron Weisstuch
*Attorney, Agent, or Firm*—Pandiscio & Pandiscio

[57] ABSTRACT

An improved photovoltaic solar cell module and method of manufacture is provided wherein the module comprises a plurality of solar cells and a novel and improved arrangement for hermetically sealing off the solar cells from the surrounding environment. A preferred embodiment of the invention has an edge seal arrangement that comprises a plurality of U-shaped channel members made of a selected thermoplastic material, such as high density polyethylene, and strips made of an ionomer positioned between and bonded to the U-shaped channel members and the outer surfaces of the front and back support sheets of the module. An alternative embodiment omits the U-shaped channel members and uses a thermoplastic backskin that overlaps and is bonded to the front support sheet of the module.

22 Claims, 5 Drawing Sheets

SOLAR CELL MODULES AND METHOD OF MAKING SAME

FIELD OF THE INVENTION

This invention relates to manufacture and construction of photovoltaic solar cell modules.

BACKGROUND OF THE INVENTION

Photovoltaic solar cells for directly converting radiant energy from the sun into electrical energy are well known, as exemplified by U.S. Pat. Nos. 5,320,684, 5,118,362, and 5,074,920. Silicon solar cells are typically small in size, e.g., 2–6 inches on a side in the case of rectangular cells made from EFG-grown silicon substrates, with the result that their power output also is small. Industry practice is to combine a plurality of cells so as to form a physically integrated module with a correspondingly greater power output. Several solar modules may be connected together to form a larger array with a correspondingly greater power output. The cells in a module are electrically connected in parallel and/or in series, and two or more modules in an array may be connected in series or in parallel, depending on the voltage and current output that is desired from the array.

A usual practice is to form a module from two or more "strings" of silicon solar cells, with each string consisting of a straight row of cells connected in series, and the several strings being arranged physically in parallel with one another. The several strings are electrically connected to one another in parallel or in series, according to voltage and current requirements. A common practice is to use solder coated copper wire, preferably in the form of a flat ribbon, to interconnect a plurality of cells in a string, with each ribbon being soldered to the front or back contact of a particular cell, e.g., by means of a suitable solder paste as described in U.S. Pat. No. 5,074,,920. The same ribbon-like wire may be used to electrically connect two or more strings and also to provide terminal leads for the module.

A common practice is to form the modules as vacuum-laminated structures that consist of front and back protective sheets, with at least the front sheet being made of clear glass or a suitable plastic material that is transparent to solar radiation, and the back sheet (also known as the "backskin") being made of the same or a different material as the front sheet. Where a protective sheet is made of glass, the customary practice is to use tempered glass, for various reasons related to manufacturing, safety, and environmental factors. Disposed between the front and back sheets so as to form a sandwich arrangement are the solar cells and a light-transmitting polymer material that encapsulates the solar cells and is also bonded to the front and back sheets. The laminated sandwich-style module provides mechanical support for the relatively thin and brittle silicon cells.

Photovoltaic solar cell modules having an effective working life of 30 years or more have been a well known industry objective. The materials used in constructing modules are selected with concern for providing adequate resistance to damage from impact and physical and thermal shock, maximizing the amount of usable solar radiation received by the cells, avoiding short-circuiting and electrical leakage, and minimizing degradation from such environmental factors as moisture, temperature, and ultra-violet sunlight-induced chemical reactions. A further industry concern is that the thirty year useful life objective be attained at a commercially acceptable cost.

U.S. patent application Ser. No. 08/197,929, filed Feb. 17, 1994 by Jack Hanoka for "Improvement in Solar Cell Modules And Method Of Making Same", now U.S. Pat. No. 5,478,402, and copending U.S. patent application Ser. No. 08/198,485, filed 18 Feb. 1994 by Jack Hanoka et al. for "Improvement In Solar Cell Modules And Method Of Making Same", now U.S. Pat. No. 5,476,553, disclose novel solar cell modules that are believed to attain a 30 year useful life as estimated by accepted life testing methods. The modules disclosed in said patents achieve their extended life as a consequence of using an ionomer as the encapsulant for the solar cells.

However, the ionomers are hydroscopic and experience has shown that an ionomer encapsulant in a solar cell module will become cloudy if it absorbs moisture. That cloudy condition is not acceptable, since it reduces light transmissibility into the module and thereby reduces module power output. Additionally, the ingress of moisture into the module is not desired because moisture tends to cause corrosion of metallic components, which in turn leads to reduced useful life. Therefore, the useful life and long-term efficiency of a solar cell module employing an ionomer as the encapsulant for its solar cells are a function of how well the module is sealed off so as to prevent air and moisture from entering the module and contributing to degradation of the silicon solar cells.

The need to provide hermetic protection for solar cell modules is well known, as exemplified by U.S. Pat. No. 4,692,577 issued to Samuelson et al. That patent discloses a prior art technique for sealing off the edges of a solar cell module that involves application of polyester tape, with a silicone adhesive applied to one side thereof, along the edges of the module once it has been assembled and laminated.

Additional problems that continue to limit commercial acceptance of photovoltaic solar cells and modules are manufacturing cost and weight. It is recognized that these problems can be reduced only by use of new materials and new manufacturing techniques.

OBJECTS AND SUMMARY OF THE INVENTION

A primary object of this invention is to provide new and improved photovoltaic solar cell modules.

Another object of this invention is to provide solar cell modules that exhibit a long working life-time and a minimum loss of power output over that life-time.

Still another object of the present invention is to provide an improved photovoltaic solar cell module which employs improved sealing means for hermetically sealing off the periphery of the solar cell module, thus assuring an extended and effective useful life for the module.

An additional object is to provide an improved photovoltaic solar cell module having improved edge sealing means characterized by at least a portion of the edge sealing means comprising the same material as the encapsulant for the interconnected cells of the module.

Another object of this invention is to provide solar cell modules that have a new, relatively light-weight backskin, thereby reducing the overall weight of the modules.

A still further object of the present invention is to provide an improved photovoltaic solar cell module which is characterized by a novel and improved arrangement for passing electrical conductors out of the module for interconnection to another module or an electrical circuit.

A further object is to provide a new and improved method of fabricating a solar cell module.

These and other objects and advantages of the invention are achieved by providing a novel photovoltaic module comprising a substantially flat array of electrically interconnected photovoltaic cells that are disposed in co-planar relationship between first and second support sheets and are encapsulated by a light-transmitting polymer (e.g., an ionomer), the module being characterized by an improved means for hermetically sealing off the photovoltaic cells from the outside environment.

In a first preferred embodiment, the module is sealed off by thermoplastic channel means that overlap and are bonded to the edges of the first and second supporting sheets. This first preferred form of module is fabricated by first assembling a sandwich comprising (1) a plurality of interconnected photovoltaic solar cells that form a flat or planar array having a front side and a back side, (2) first and second sheets formed of an ionomer overlying and underlying said front and back sides of said array respectively, (3) front and back support sheets overlying and underlying said first and second sheets of ionomer respectively, (4) one or more strips formed of an ionomer overlying and engaging said front support sheet at the edges thereof; and (5) one or more strips formed of an ionomer underlying and engaging said back support sheet at the edges thereof. Next, a channel-shaped sealing means, preferably in the form of a plurality of U-shaped thermoplastic channel members, is slipped over the edges of the two support sheets in engagement or near-engagement with the ionomer strips. Then the foregoing sandwich is subjected to a selected heating and cooling cycle under suction and pressure, preferably by means of a vacuum press, so as to (1) remove air from between the various layers of materials, (2) cause the ionomer sheets and strips to melt enough to permit the ionomer sheets to flow into and fill all available spaces between said support sheets and also permit the ionomer strips to melt and wet said channel means, and (3) cool said heated sandwich so as to (a) cause the ionomer supplied by said ionomer sheets to solidify and form a solid transparent mass that is bonded to said support sheets, said cells, and said channel means and also (b) cause the ionomer to solidify and bond said channel means to said support sheets.

A preferred alternative embodiment of the invention comprises a transparent front support sheet and a backskin material that extends around and is sealed to edges of the front support sheet.

This invention also comprises a novel construction and method for bringing terminal electrical leads out of the module and providing an hermetic seal between the terminal leads and the adjoining area of the module. The invention includes two different modes of bringing the terminal leads out from the module.

BRIEF DESCRIPTION OF THE DRAWINGS

Other objects, features and advantages of the invention are set forth in the following detailed specification which is to be considered together with the accompanying drawings in which:

FIG. 5 is a cross-sectional view, similar to that shown in FIG. 4, but including additional channel-shaped sealing means; also FIG. 5 illustrates the module after it has been laminated;

Like numerals are used in the several figures to identify like components.

DETAILED DESCRIPTION OF PREFERRED AND ALTERNATIVE EMBODIMENTS

Figure 1:
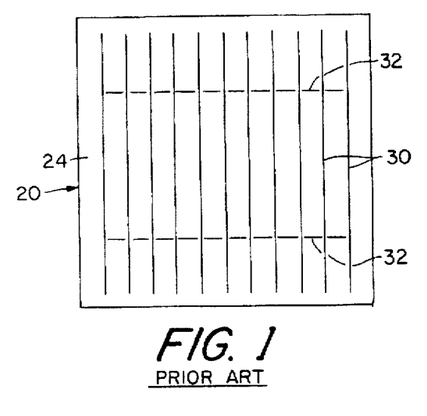
FIG. 1 is a front view of a well-known type of photovoltaic cell.
Figure 2:
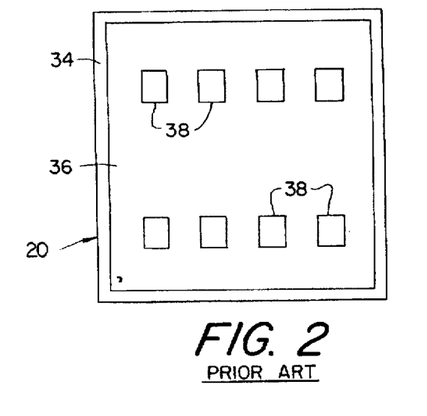
FIG. 2 is a rear view of the photovoltaic cell shown in FIG. 1.

FIGS. 1 and 2 illustrate a conventional solar cell 20 of a kind utilized in making prior art modules and also modules embodying the present invention. Each cell comprises a silicon EFG-grown substrate in the form of a sheet or wafer that has been processed so as to have a shallow P-N junction (not shown) adjacent its front surface 24. Typically the junction is located between 0.3 and 0.5 micron below front surface 24. The cell also has on its front surface 24 a front contact in the form of a grid consisting of an array of narrow, elongate, parallel silver metal fingers 30 interconnected by two silver metal bus bars 32. Additionally, a thin silicon nitride anti-reflective coating (not shown) covers those portions of front surface 24 of the substrate that are not occupied by the grid electrode. The silicon nitride coating may be formed in various ways, preferably according to the method(s) described in U.S. Pat. No. 4,751,191 issued to Gonsiorawski et al, U.S. Pat. No. 5,320,684 issued to Amick et al, and U.S. Pat. No. 5,118,362 issued to St. Angelo et al.

The rear surface 34 of cell 20 comprises a rear contact 36 (FIG. 2) that is made of aluminum metal and terminates short of the outer edges of the rectangular cell so as to have an uncoated margin portion that extends along each side of the cell substrate co-extensive with the periphery of the substrate, and also two rows of silver metal soldering pads 38 that fill apertures formed in the rear aluminum contact and are fused to the underlying solar cell substrate. Pads 38 overlap rear contact 36 around the periphery of the apertures in that contact. Although FIG. 2 shows eight soldering pads, it is to be understood that the number and spacing of the soldering pads may be varied and is not critical to this invention.

Preferably but not necessarily, the silicon cells are made using EFG-grown substrates. Such substrates typically have a thickness in the range of 0.008–0.014 inch. The finished cells, i.e., the cells with front and back contacts applied thereto, have an overall thickness in the range of 0.010–0.018 inch. Solar cells 20 of the type shown in FIGS. 1 and 2 are well known and, for example, are disclosed by U.S. Pat. Nos. 5,118,362 and 5,178,685, PCT International Publication No. WO 92/02952, and said copending U.S. patent applications Ser. Nos. 08/197,929 (now U.S. Pat. No. 5,478,402) and U.S. Ser. No. 08/198,485 (now U.S. Pat. No. 5,476,553)

Figure 3:
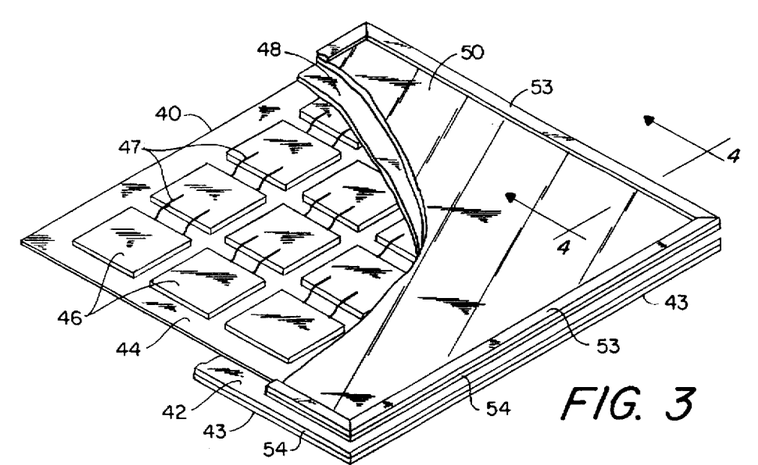
FIG. 3 is a fragmentary perspective view in elevation illustrating a partially assembled solar module according to a first embodiment of the present invention.
Figure 4:
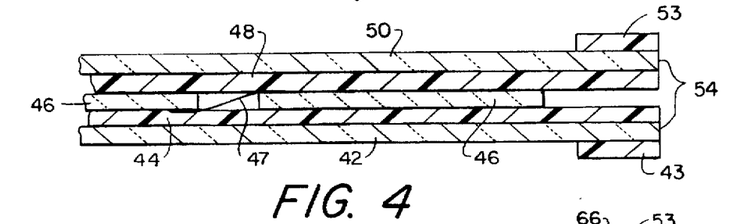
FIG. 4 is a cross-sectional view taken along line 4—4 in FIG. 3.
Figure 5:
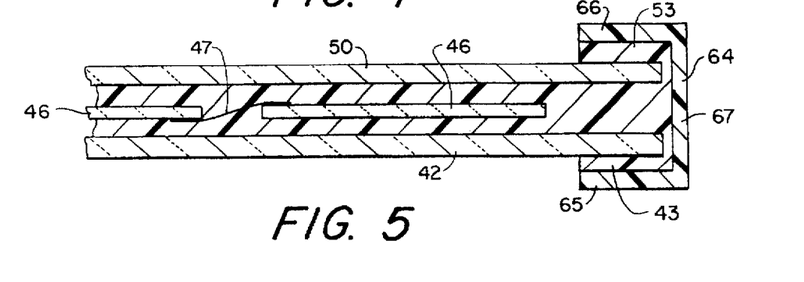

FIGS. 3–5 illustrate the components and mode of construction of a module 40 which constitutes one embodiment of the present invention. In the following description it should be understood that module 40 (and its mode of assembly) are described with the front side of the module facing down, but the module could be assembled back side down with no change in result. Also it is recognized that it may be possible to manufacture the same module by a different method of construction.

Module 40 is formed by a plurality of components commencing with a top (front) protective support sheet 42 of clear transparent glass and an ionomer strip 43 that is laminated or otherwise fixed to its outer surface. Strip 43 is located adjacent to each side edge of sheet 42. Strip 43 may be formed as a single unitary rectangular ring, but preferably it is made up of a plurality of straight segments, e.g., four segments, one for each side edge. Preferably the segments constituting strip 43 are bonded to the glass by subjecting them to heat and pressure.

The components that are used to make the module also include a first encapsulating layer in the form of a flat rectangular sheet 44 made of an ionomer, and a flat array of rectangular silicon solar cells 46 that are interconnected by ribbon-like conductors 47 in series or in parallel according to the output voltage and current requirements. Cells 46 have essentially the same construction as the cells 20 shown in FIGS. 1 and 2. Cells 46 are arranged in straight rows, i.e., strings, and an end cell in one string is connected to an adjacent string by conductors (not shown) similar to conductors 47. As described hereinafter, the whole interconnected array is terminated by insulated terminal leads that extend out from the module for connection to an exterior circuit.

The conductors 47 add to the effective thickness of the solar cells. Typically, addition of conductors 47 will increase the thickness of the array of cells by about 0.005–0.010inch, thereby increasing the maximum thickness of the array to between about 0.015 and about 0.023 inch.

Cells 46 are disposed with their grid contacts (corresponding to elements 30, 32 in FIG. 1) facing glass plate 42. Fabrication of the module also includes provision of a second encapsulating layer in the form of a flat rectangular sheet 48 of an ionomer. This is placed over the array of solar cells 46 and a bottom (back) protective support sheet 50 made of glass is placed over second encapsulating layer 48. Sheet 50 has an ionomer strip 53 on its outer surface adjacent each side edge thereof in a manner corresponding to the placement of ionomer strip 43 on support sheet 42. Strip 53 may be a one-piece rectangular ring or, like strip 43, it may be made up of a plurality of segments. In the latter case it is preferred, but not necessary, that the segments of strips 43 and 53 abut one another at their ends. Preferably, ionomer sheets 44 and 48 extend beyond the periphery of the array of solar cells 46, preferably to the edges of support sheets 42 and 50.

This embodiment of the invention also includes a plurality of U-shaped thermoplastic channel members 64 (FIG. 5), one for each side edge of the foregoing assembly. Channel members 64 are designed to embrace the assembled components, with their flanges 65, 66 overlying and covering the ionomer strips 43 and 53, respectively, and their webs 67 covering edges 54 of support sheets 42 and 50. In their preformed state, the opposite ends of the channel members are mitered at a 45 degree angle so as permit them to form a rectangular frame characterized by tight, close fitting joints at the corners where the channel members come together.

Each of the ionomer strips 43 and 53 is rectangular in cross-section, preferably measuring about 0.010 to about 0.050 inch thick and about 0.250 to about 0.5 inch wide. Preferably, as shown in FIG. 3, ionomer strips 43 and 53 extend along substantially the entire length of each side of support sheets 42 and 50. Ionomer strips 43 and 53 may be mitered at their ends as shown in FIG. 3, or they may be cut so as to abut or overlap each other at the corners of the module. In any case, they are cut and positioned so as to form tight joints at the respective corners of the module.

The preferred mode of attaching ionomer strips 43 and 53 to the support sheets is to press them against the support sheets while the latter are heated to a temperature of about 50° C. The hot tack properties of the ionomer strips cause them to adhere securely to the surface of the heated glass sheet. If desired, the outer facing surfaces of glass sheets 42 and 50 may be coated with a film of a suitable liquid coupling agent to improve bonding of ionomer strips 43 to the glass. Pre-bonding ionomer strips 43 and 53 to glass sheets 42 and 50 is preferred but not essential. In assembling the components shown in FIG. 4, ionomer strips 43 and 53 may be fastened in place by other means such as adhesives that are well known in the art. In assembling the module's components with front glass sheet 42 facing down, ionomer strip 53 may be pre-bonded to the rear (upwardly facing) side of glass support sheet 50 or may be loosely positioned on that sheet adjacent its edges. This loose assembly shown in FIG. 3 is laminated together, preferably by means of a heated vacuum press as described below so as to form an integrated module as shown in FIG. 5.

Preferably, U-shaped channel members 64 are extruded from a high-density polyethylene since that material bonds well to the ionomer and also has other physical characteristics such as high resistance to degradation from environmental factors such as heat, light, water, and also a wide variety of corrosive compounds. However, moderate and even low density polyethylene may be used, but with less desirable results. Channel members made of other thermoplastic materials that are capable of bonding directly to the ionomer also may be used in practicing this invention.

Referring to FIG. 5, the several channel members preferably are formed with their flanges 65 and 66 being identical in shape, size, and thickness, while their webs 67 may be of like length and of like or different thickness than the flanges. By way of example but not limitation, channel members 64 have a height (the vertical dimension as viewed in FIG. 5) of about 0.625 inch, and a width (the horizontal dimension as viewed in FIG. 5) of about 0.750 inch, with the flanges and web having a uniform thickness of about 0.125 inch. The free ends of flanges 65 and 66 may (but need not) be chamfered on their mutually confronting inner surfaces to facilitate slipping the channel members over the strips 43 and 53 associated with the sheets 42 and 52, respectively when those sheets are assembled with the cells and the ionomer sheets as shown in FIG. 4. Preferably, as mentioned previously, the opposite ends of each channel member are mitered at a 45 degree angle so as to form a tight or close corner joint at each corner of the module.

Each of the layers 44 and 48 may comprise one or more sheets of an ionomer, depending on the thickness in which the ionomer sheets are available commercially. The ionomer layers 44 and 48 also may comprise certain additives for extending the effective useful life of the module, as described in said two copending U.S. applications Ser. Nos. 08/179,929 (now U.S. Pat. No. 5,478,402) and U.S. Ser. No. 08/198,485 (now U.S. Pat. No. 5,476,553). By way of example but not limitation, layers 44 and 48 may measure about 0.005-0.015 inch thick.

Preferably, module 40 is assembled and formed according the following method and procedure. First, ionomer strip(s) 43 is (are) fixed to the outer surface of glass sheet 42, by heating or by means of an adhesive. Then glass sheet 42 is positioned with its outer surface and ionomer strip(s) 43 face down on a supporting table or other support. Then the first ionomer encapsulating sheet 44 is placed over the inner surface of glass sheet 42. Next, the array of interconnected silicon solar cells 46 is placed on top of sheet 44 with the grid contacts of the cells facing glass plate 42. Then the second ionomer encapsulating sheet 48 is placed over the cells 46, and the second glass supporting sheet 50 (preferably with strips 53 already attached thereto) is placed over layer 48 in alignment with the first (front) glass sheet 42. Then channel members 64 are slipped over the edges of the top and bottom glass sheets 42 and 50. Thereafter, this entire loose assembly is laminated together to form an integrated module. Preferably this lamination procedure is accomplished using a heated vacuum press. The press is operated so as to cause the ionomer and polyethylene components to melt or at least soften enough to achieve wetting at the various interfaces. The heating step is followed by a cooling step which results in solidification of the thermoplastic materials and fusing (bonding) thereof to adjacent components.

As an alternative procedure, a first lamination step involving all of the foregoing components except for channel members 64 may be performed. Then channel members 64 may be applied over the edges of the front and back glass sheets, after which this resulting assembly will be heated, preferably in a heated vacuum press, so as to cause the channel members to fuse to one another and also to the ionomer sheets and strips.

It should be noted that with either procedure, the polyethylene channel members will fuse together at the corners of the module, and also will fuse to the ionomer sheets and strips, so as to form an apparently seamless structure.

As used herein, the term "ionomer" means and denotes a thermoplastic resin containing both covalent and ionic bonds derived from ethylene copolymers. For the purposes of this invention, it is preferred to use monomers formed by partial neutralization of ethylene-methacrylic acid copolymers or ethylene-acrylic acid copolymers with inorganic bases having cations of elements from Groups I, II, or III of the Periodic table, notably, sodium, zinc, aluminum, lithium, magnesium, and barium. The term "ionomer" and the resins identified thereby are well known in the art, as evidenced by Richard W. Rees, "Ionic Bonding In Thermoplastic Resins", DuPont Innovation, 1971, 2(2), pp. 1-4, and Richard W. Rees, "Physical Properties And Structural Features Of Surlyn Ionomer Resins", Polyelectrolytes, 1976, C, 177-197.

By way of example but not limitation, a carbon-black modified, zinc-based ionomer may be used for the outer surface sealing strips 43 and 53 and transparent layers 44 and 48. However, it is preferred to use sodium-based ionomer resins for the transparent layers 44 and 48. The zinc-based ionomer may be the one manufactured and sold by DuPont, under the trademark designation SURLYN 1702. The Surlyn 1702 ionomer offers the advantage of excellent hot tack strength. Of course, various other ionomer products may also be used, e.g., DuPont's Surlyn 1601 or 1650 compositions.

Aminofunctional coupling agents, such as the one available from the Union Carbide Corporation under the tradename Organofunctional Silane A-1100, which is believed to be gamma-aminopropyltriethoxysilane, may be used to improve bonding of the ionomer (e.g., layers 44 and 48 and strips 43 and 53) to the surfaces of the respective glass panes. However, it should be understood that improved modules may be provided according to this invention without using a coupling agent.

Each solar cell module has at least two terminal lead wires, one soldered to a grid contact of a first cell of a string and the other soldered to the back contact of the last cell of the same string (in the case of a single string module) or a different string (in the case of a module having two or more interconnected strings). These lead wires may pass out of the same or different areas of the module, e.g., from the same side edge or from opposite side edges, as preferred or as required by module design or application.

Figure 6:
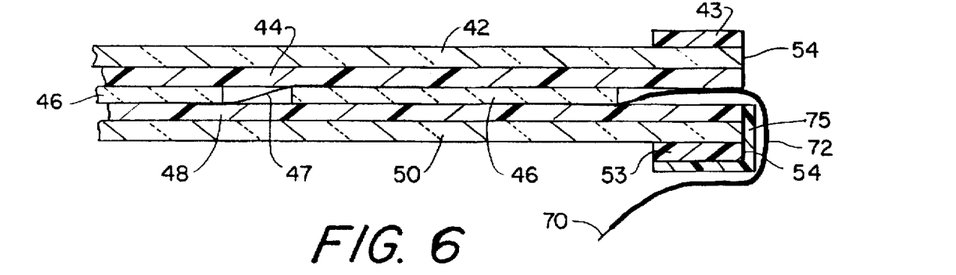
FIG. 6 is a cross-sectional view similar to FIG. 4 but showing addition of an electrical conductor extending from the outside edge of the partially assembled solar module.
Figure 7:
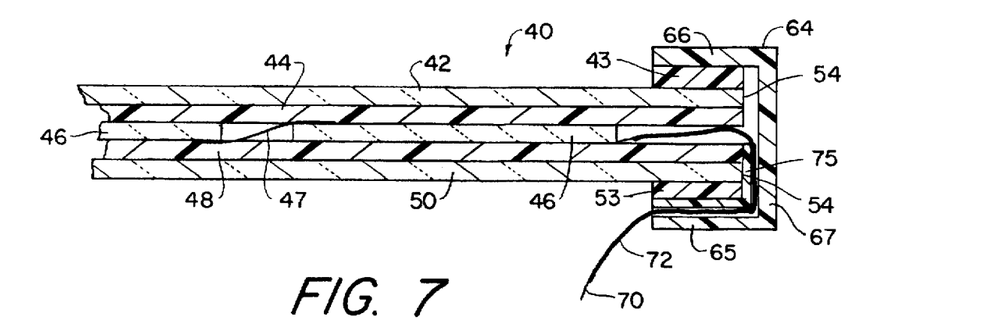
FIG. 7 is a cross-sectional view showing addition of U-shaped channel members to the assembly of FIG. 6 prior to lamination.
Figure 8:
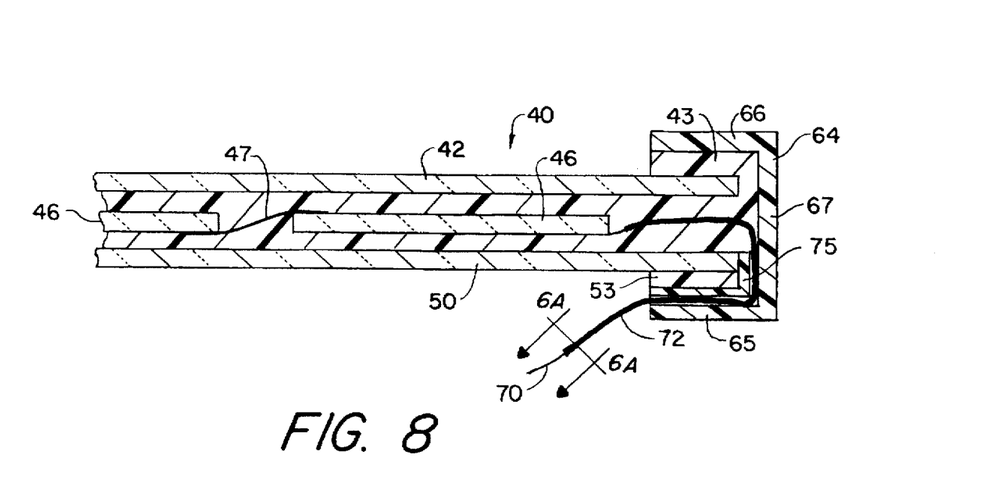
FIG. 8 is a cross-sectional view showing the assembly of FIG. 7 after lamination.
Figure 16:
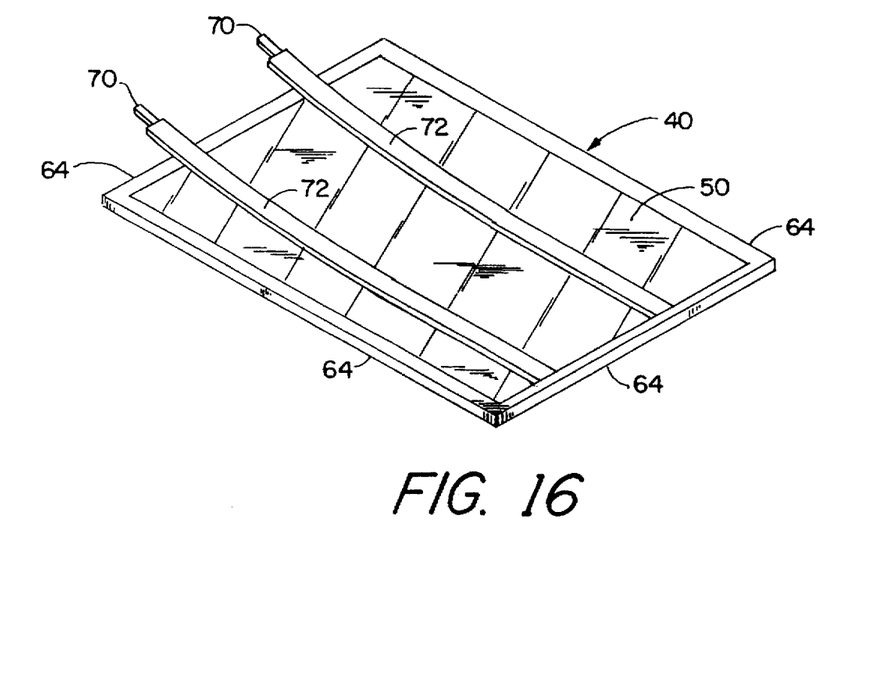
FIG. 16 is a perspective view of the rear side of one form of module made according to this invention with terminal leads brought out at its perimeter.

FIGS. 6-8 show a preferred way of bringing a terminal lead wire 70 out of a module of the type shown in FIGS. 3-5. Lead wire 70, preferably in the form of a flat copper ribbon as described above, is soldered to the back contact of an end cell 46. Prior to lamination, lead wire 70 is brought out from between the two ionomer sheets at a side edge of the module that is to be constructed, as shown in FIG. 6, and then it is reversed on itself so as to extend back alongside of the rear glass sheet 50. Of course, it will be appreciated that a second lead wire (not shown) is connected to the front contact of another solar cell that is at the other end of the array of cells 46, and that it may be brought out of the assembled components alongside lead 70 (as shown in FIG. 16) or out from another side edge of those assembled components.

Figure 6A:
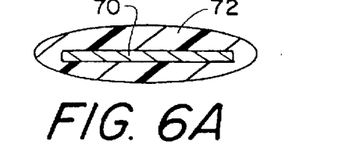
FIG. 6A is a cross-sectional view taken along line 6A—6A of FIG. 8.

Still referring to FIGS. 6-8, lead wire 70 is enclosed along a substantial portion of its length by means of a sheath in the form of a heat shrinkable, electrically-insulating tubing 72 (FIG. 6A). The heat shrinkable tubing is applied by first sliding it over the lead wire 70 so that only a portion of the wire at its free outer end is left exposed, and then heating the tubing until it shrinks tightly around the wire. The heat-shrinking is accomplished prior to the lamination procedure, although it is conceivable that shrinking of the tube may be accomplished during and as part of the laminating heating procedure. It has been found that a heat shrinkable tubing sold by Raychem Corporation under the product designation VERSAFIT 125, is suitable for this purpose. Still other heat-shrinkable materials known to persons skilled in the art may be used, provided that they will bond to the channel members (or to the backskin described hereinafter in relation to FIGS. 13 and 14.

In order to protect lead wire 70 against damage by abrasion with the adjacent edge of one of the glass sheets 42 and 50, an L-shaped support member 75 may be disposed at the side edge of the assembled components where the insulated lead wire 70 will exit. L-shaped support member 75 preferably is made of a suitable thermoplastic material that will fuse to the ionomer under heat and pressure, e.g. polyethylene, and is sized and positioned so as to be in close engagement with the edge of adjacent glass support member 50 (or 42 as the case may be). By way of example but not limitation, L-shaped support member 75 may be approximately 0.010 inch thick, and its horizontal leg (as seen in FIGS. 6 and 7) may be between about 0.250 to 0.500 inches wide while its vertical leg may be between about 0.150 to 0.175 inch long.

Lead wire 70 and its protective sheath 72 are passed around L-shaped support member 75, so that when the channel members 64 are placed over the four edges of the assembled components, one of the channel members will engage the sheathed lead wire 70 and hold it in place between that channel member 64 and L-shaped support member 75 (as shown in FIG. 7).

After the U-shaped channel members 64 have been slipped over the edges of the assembled components, the resulting sandwich is heated under vacuum to a suitable temperature, e.g., about 170 to 180° C., and held there long enough to cause ionomer strips 43 and 53 and L-shaped support members 75 to flow into intimate contact with U-shaped channel members 64 and the polyolefin sheath 72. During this heating step, the two ionomer layers 44 and 48 soften and flow so as to (1) fill the voids from which air is evacuated by the vacuum applied to the sandwich, (2) encapsulate and wet the array of cells, and (3) wet glass support members 42 and 50, and the inner surfaces of the plurality of channel members 64 (FIG. 6). The polyethylene frame members also soften during the heating step. Then the resulting sandwich is cooled to achieve a solid laminated structure.

Following is a preferred procedure for laminating a sandwich as shown in FIGS. 3–8. The sandwich is heated up to about 170 to 180° C. (within about 5–10 minutes) and then held there for between about 10 to 60 minutes, preferably for between about 10 to 20 minutes. During the heating, the components of the sandwich and the sealing means are compressed together under a pressure not exceeding about 14 to 14.6 PSI. Preferably the evacuation of air from the sandwich is commenced as soon as the vacuum laminator press is closed and continues until the desired heating period has elapsed. Then the vacuum is released and the press is opened to allow the assembly to cool. The assembly is allowed to cool to ambient temperature, whereupon the ionomer and the polyolefin insulation sheath bond to each other and to the two glass plates and the polyethylene channel members. As seen in FIGS. 5 and 8, after the lamination procedure the two ionomer strips form one continuous mass that is fused to the U-shaped channel members 64, L-shaped support members 75 and the polyolefin insulation 72 of lead wire 70, thus forming a substantially hermetic seal at the edges of the completed module 40. If desired, as a further optional measure, a rectangular frame (not shown) made of aluminum or other metal may be applied over the channel members 64 to the four edges of the module to facilitate mounting the module to a desired mounting structure (not shown).

By way of example, a solar cell module as shown in FIGS. 3–8 may be formed according to this invention by laminating together (a) two panes of ⅛" thick glass each measuring 50" wide and 74" long, (b) two sheets of additive-modified Surlyn 1601 ionomer having a thickness of 0.010" for use as layers 44 and 48, (c) eight strips of an ionomer measuring 0.010 inch thick by 0.5 inch wide for use as strips 43 and 53, (d) a polyethylene support member 75 measuring about 0.010 inch thick, (e) four U-shaped channel members 64 each having a flange thickness and web thickness of about 0.125", a web height of 0.750 inch, and a flange width of 0.050 inch, and (f) an array of silicon solar cells of the type illustrated in FIGS. 2 and 3 having two solder coated copper lead wires 70 attached thereto, with portions of the lead wires sheathed in heat-shrunk electrically-insulating polyolefin tubing. The lead wires are disposed so as to extend out from the same edge behind the rear glass sheet, in the manner shown in FIGS. 6–8 (and 16). The Surlyn 1601 encapsulating ionomer is modified by addition of 0.5 wt. percent Cyasorb 5411 and 0.5 wt. percent Cyasorb 3346, as disclosed by U.S. application Ser. Nos. 08/197,929 (now U.S. Pat. No. 5,478,402) and U.S. Ser. No. 08/198,485 (now U.S. Pat. No. 5,476,553). Layers 44 and 48 are approximately the same in width and length as the glass panes. Each strip 43 and 53 of ionomer is made of black-colored Surlyn 1702, which is believed to be a zinc-based ionomer having carbon-black added to it. The array is made up of twelve strings of cells, with each string consisting of 18 cells connected in series. The strings are arranged in side-by-side relation and connected in parallel. A sandwich is formed in the manner described above in connection with FIGS. 3–8. Before the sandwich is assembled, the surfaces of the glass which contact the ionomer sheets and strips are washed and then coated with Union Carbide Organofunctional Silane A-1100 coupling agent and then dried.

This sandwich is then placed in a Spire Corporation SPI laminator Model 460, which is essentially a heated vacuum-type press. One wall of the press is a flexible membrane which is drawn against an opposite wall of the press as vacuum is applied, thereby compressing the sandwich under a pressure of approximately 14.7 pounds per square inch. The laminator is closed, vacuum is applied for a selected period on the order of minutes, and then heat is applied to the sandwich while it is still subject to vacuum. The sandwich is brought up to a temperature of approximately 175° C., reaching that temperature in approximately 5 to 10 minutes. The sandwich is then kept at that temperature for approximately another 15 minutes while under a pressure of about 14 pounds per square inch. The vacuum to the press is then released so as to remove the pressure on the sandwich and at about the same time the heaters of the press are deenergized to terminate active heating. The laminator is then opened and the laminated sandwich is allowed to cool to room temperature. The finished module has terminal leads projecting from one edge thereof along its rear glass support sheet, as shown in FIG. 16.

Figure 9:
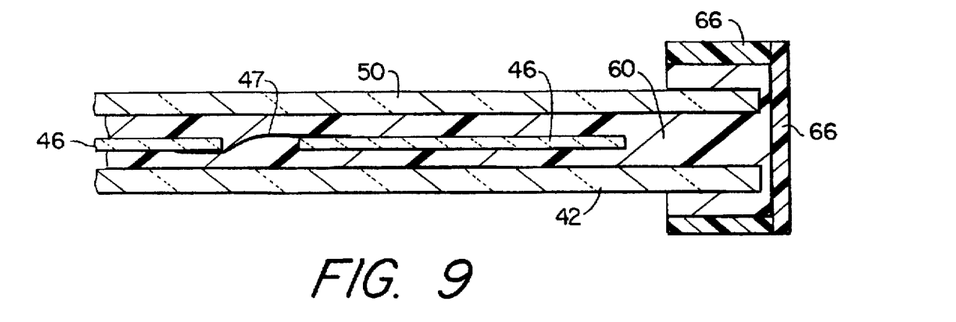
FIG. 9 is a cross-sectional view, similar to FIG. 5, but illustrating a different form of edge sealing means.
Figure 10:
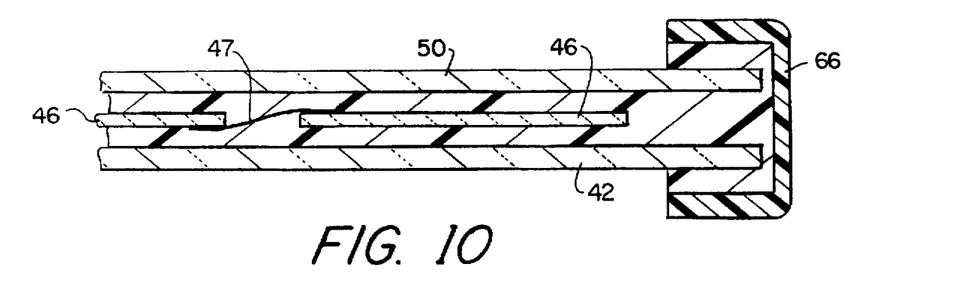
FIG. 10 is a cross-sectional view, similar to FIGS. 5 and 9, showing still another variation of the sealing means.

FIGS. 9–15 illustrate other modifications of the invention. For instance, as seen in FIGS. 9 and 10, the U-shaped channel members 64 of FIG. 8 may be replaced by polyethylene tape 66. Polyethylene tape 66 may be applied in the same manner as described above in connection with U-shaped channel members 64, in either separate pieces as shown in FIG. 9 or in one continuous piece as shown in FIG. 10. In either case, the polyethylene tape may be coated with an adhesive so that it will stick to the ionomer strips while the assembled components are being placed in the laminator apparatus, thereby assuring that the components will be appropriately positioned relative to one another during the laminating procedure.

In yet another alternative embodiment (not shown) of the present invention, U-shaped channel members 64 may be co-extruded with an ionomer so as to have a layer of ionomer on its three interior surfaces, thereby obviating the need for ionomer strips 43 and 53. The co-extruded U-shaped channel members 64 are assembled to module 40 and processed in the same manner as disclosed hereinabove.

Figure 11:
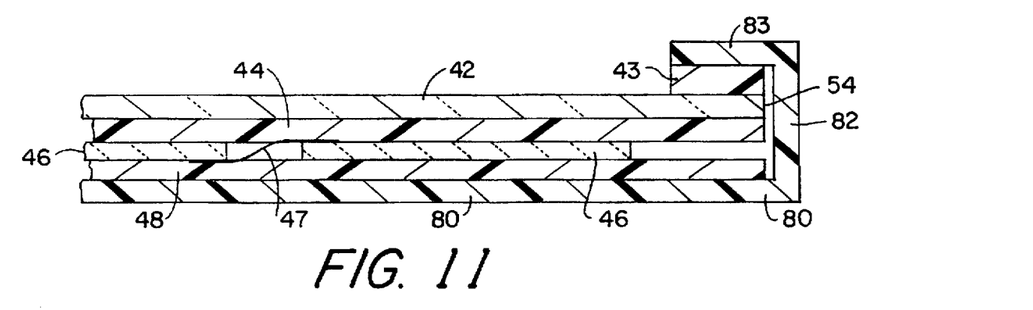
FIG. 11 is a cross-sectional view, taken prior to lamination, showing a further alternative embodiment of the present invention wherein the second support sheet serves to provide an edge seal.
Figure 12:
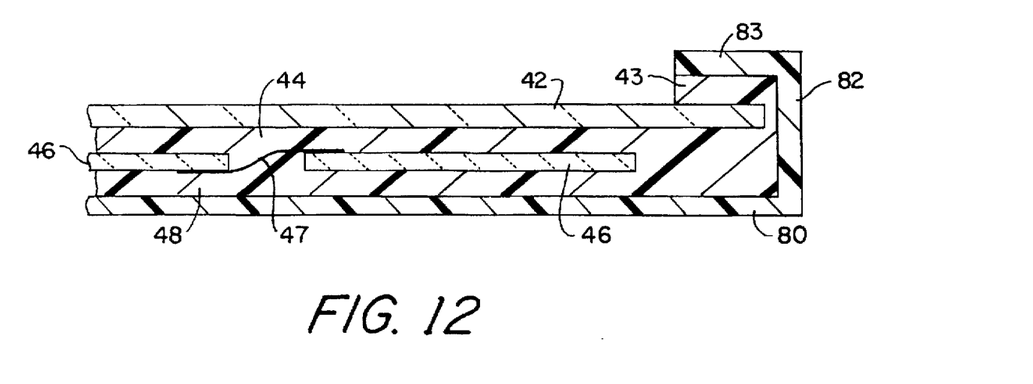
FIG. 12 is a cross-sectional view showing the assembly of FIG. 11 after lamination.
Figure 13:
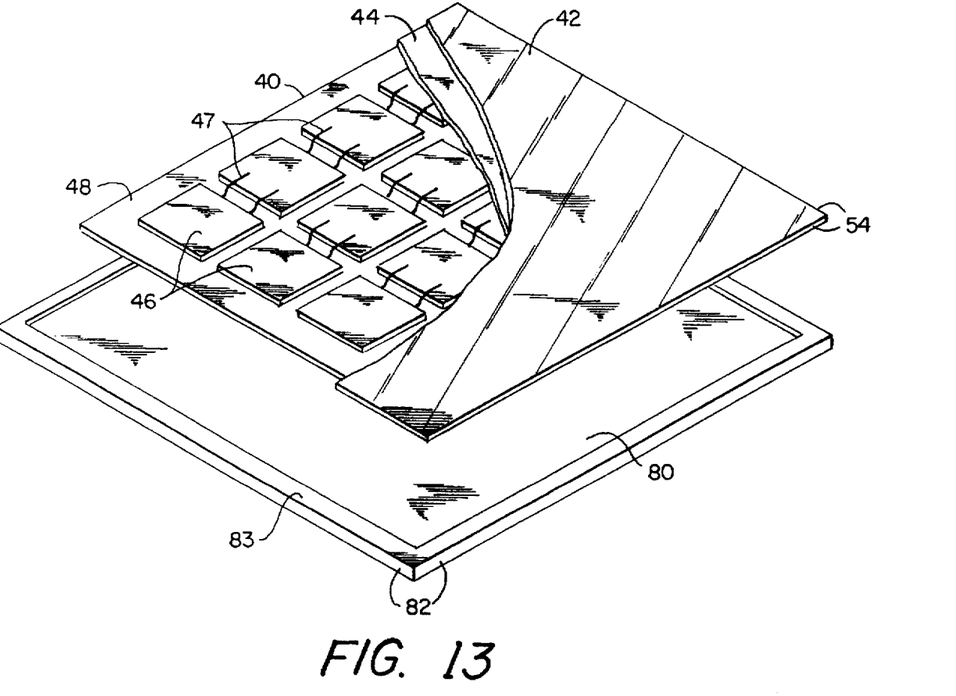
FIG. 13 is a fragmentary exploded perspective view illustrating a partially assembled solar module comprising a second support sheet having channeled peripheral edges.

Referring to FIGS. 11–13, a further alternate embodiment of the present invention comprises replacing rear glass support sheet 50 with a polyethylene (preferably high density) support sheet 80 having a pre-formed channel 82 along its entire perimeter. Ionomer strip(s) 43 are disposed between front glass sheet 42 and the overlapping portion 83 of the pre-formed channel 82. After lamination the ionomer from sheets 44 and 48 and strip 43 will form a tight seal with polyethylene sheet 80 along the entire periphery of the module.

Figure 14:
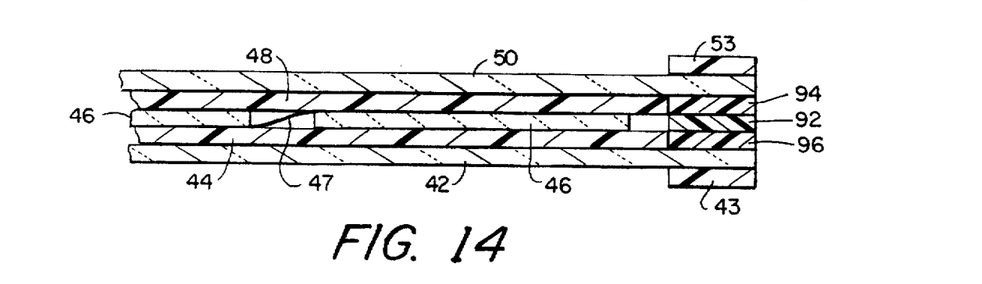
FIG. 14 is a cross-sectional view, similar to FIG. 4, showing another form of sealing means prior to lamination.
Figure 15:
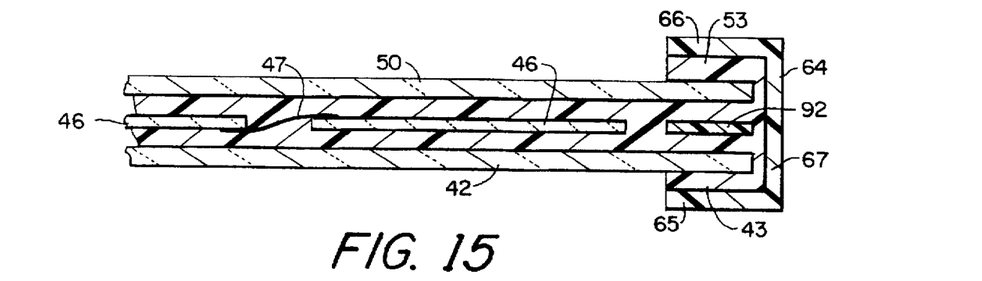
FIG. 15 is a cross-sectional view showing the assembly of FIG. 14 with a supporting frame after lamination.

FIG. 14 shows a further alternate embodiment of the present invention in which a multi-layer member, comprising a center strip 92 of high density polyethylene disposed between two ionomer strips 94 and 96, is placed between glass sheets 42 and 50 adjacent their edges. This multi-layer member is preferably formed in four segments, with each segment being co-extensive with and extending along one side edge of sheets 42 and 50. In this embodiment, ionomer sheets 44 and 48 have their peripheral edges recessed from the peripheral edges of support sheets 42 and 50, and the multi-layer segments (92, 94, 96) fill the space between the edges of the ionomer sheets and the edges of support sheets 42 and 50. Processing of this embodiment proceeds according to the method of forming the embodiment of FIGS. 1–3. FIG. 15 illustrates the laminated product, with the ionomer components being bonded to the high density polyethylene channel members and the polyethylene layers 92 during the lamination process. The multi-layer strip 92, 94, 96 adds structural supposed to the edges of module 40 by means of the high density polyethylene center strip 92.

Referring again to FIGS. 11 and 12, a preferred embodiment of the invention comprises replacing the rear glass plate 50 with a backskin comprising a sheet of flexible polyethylene 80 that is sized so as to extend beyond the perimeter of glass sheet 42. In this case sheet 80 does not have a pre-formed channel section as shown at 82, but instead the sheet is sufficiently flexible to allow its edge portions to be folded or bent around the edges of ionomer sheets 44 and 46 and glass sheet 42, so that those edge portions overlie glass sheet 42 in overlapping and contacting relation with ionomer strips 43. Strips 43 are pre-bonded to glass sheet 42. The edge portions of the polyethylene sheet are held in place against ionomer strips 43 while the assembly is introduced to the laminator. This may be done by means of an adhesive or an adhesive tape or by heating sections of the polyethylene sheet so as to tack those sections to strips 43. The resulting assembly of components are laminated together using a heated vacuum press in the manner described above. The resulting module is characterized by hermetically sealed solar cells.

Figure 17:
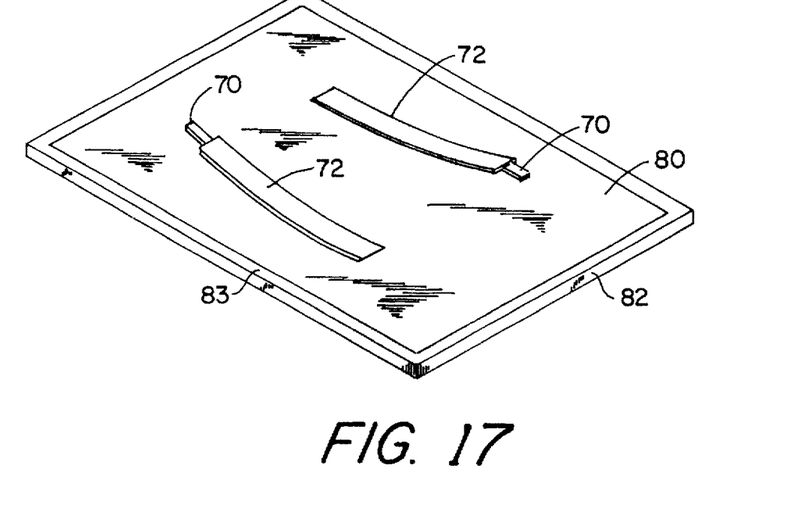
FIG. 17 is a perspective view of the rear side of a second form of module made according to this invention with terminal leads brought out through its backskin.

FIGS. 16 and 17 show how terminal leads are brought out of the modules described above. FIG. 16 relates to the modules illustrated in FIGS. 3–8. With such modules, the terminal leads 70, with heat shrink electrically-insulating tubing 72, are brought out from one edge of the module and extend along its rear protective sheet 50.

FIG. 17 relates to the modules made using a flexible thermoplastic backskin, e.g., polyethylene sheet 80, instead of a rigid or semi-rigid support sheet such as glass sheet 50. In this case the terminal leads 70, with their heat shrink electrically-insulating sheathes 72, are brought out through slits that are formed in the backskin prior to lamination.

During the lamination procedure the heat shrink tubing 72 and the backskin are fused together to form an hermetic seal where the terminal leads pass out through the backskin.

It is, of course, possible to modify the modules described above without departing from the scope of the present invention. Thus, for example, the frame members may be made of low, moderator high density polyethylene, or even of some other thermoplastic material that bonds to the ionomer and also can be molded to the desired shape and exhibit the desired stiffness, e.g., polypropylene. The polyethylene backskin may be replaced by some other moisture-impermeable thermoplastic material that will bond readily to the ionomer. The shapes of the components also may be varied.

Still other modifications and changes will be obvious to persons skilled in the art.

This invention offers a number of advantages. First of all, it provides modules with improved edge sealing, thereby preventing absorption of moisture by the encapsulant and extending the useful life of the modules. Secondly it provides a reduction in manufacturing cost. Thirdly, in the case where a polyethylene sheet is used as the backskin, there is a material reduction in overall module weight. A further advantage is that the invention makes use of known materials and can be practiced using commercially available laminating equipment, all of which contribute to a cost reduction as well as production of solar cell modules having consistent, reliable, and high outputs.

What is claimed is:

1. A photovoltaic module comprising in combination:

first and second sheets of supporting material disposed in substantially parallel spaced relationship to one another, at least said first sheet comprising a light-transparent material, said first and second sheets having periphery-defining edges that are aligned with one another;

an array of electrically interconnected photovoltaic cells occupying at least a portion of the space between said first and second sheets;

a mass of an ionomer between said sheets in surrounding and encapsulating relation with said cells; and sealing means for sealing off said space at said edges;

characterized in that said sealing means comprises (a) first and second layers of a first thermoplastic material disposed on and bonded to outer surfaces of said first and second sheets respectively adjacent said edges thereof, said first and second layers covering narrow areas of said adjacent support sheets, and (b) at least one moisture-impermeable member made of a second thermoplastic material that is capable of bonding with said first thermoplastic material under heat and pressure, said at least one moisture-impermeable member extending along and across said edges and overlapping said first and second layers, said ionomer being bonded to said cells and said support sheets, and said layers being bonded to said support sheets and said at least one moisture-impermeable member.

2. A module according to claim 1 wherein said first and second layers are made of an ionomer.

3. A module according to claim 2 wherein said layers have been bonded to said first and second sheets under heat and pressure.

4. A module according to claim I wherein said at least one moisture-impermeable member is a plurality of preformed U-shaped channel members.

5. A module according to claim 4 wherein said channel members are made of high density polyethylene.

6. A module according to claim 1 wherein said at least one moisture-impermeable member is a thermoplastic tape.

7. A module according to claim 6 wherein said thermoplastic tape is made of polyethylene.

8. A photovoltaic module comprising in combination:

first and second rectangular support sheets disposed in substantially parallel spaced relationship to one another, said first support sheet comprising a light transparent material and said second support sheet being made of a thermoplastic material and being formed so as to overlap said first sheet at the edges thereof;

an array of electrically interconnected photovoltaic cells disposed in the space between said first and second sheets, each of said cells having a first light-receiving surface facing said first support sheet and a back surface facing said second support sheet;

a mass of an ionomer extending throughout said space in surrounding and encapsulating relation with said cells; and thermoplastic sealing means on the outwardly facing surface of said first sheet for sealing the overlapping portion of said second sheet to said outwardly facing surface of said first sheet.

9. A module according to claim 8 wherein said sealing means is an ionomer that is heat bonded to said first and second support sheets.

10. A module according to claim 9 wherein said first support sheet is made of glass and said second support sheet is made of polyethylene.

11. A photovoltaic module comprising in combination:

first and second support sheets disposed in substantially parallel spaced relationship to one another, said sheets having periphery-defining edges that are aligned with one another, at least said first sheet being made of a light-transparent material;

an array of electrically interconnected photovoltaic cells and an ionomer disposed in the space between said first and second sheets, said photovoltaic cells being surrounded and encapsulated by said ionomer and said ionomer being bonded to said first and second sheets, said array of photovoltaic solar cells being terminated by electrical conductors that extend outside of said module; and substantially hermetic sealing means for sealing off said space between said first and second sheets, said substantially hermetic sealing means surrounding and overlapping said first and second sheets at said periphery-defining edges, said sealing means comprising a first thermoplastic means bonded to at least one of said support sheets adjacent the edges thereof, and second thermoplastic means extending across said edges and overlapping and bonded to said first thermoplastic means.

12. A module according to claim 11 wherein said first thermoplastic means comprises an ionomer composition.

13. A module according to claim 11 wherein said second thermoplastic means comprises a plurality of U-shaped channel members that are fused to said first thermoplastic means.

14. A module according to claim 13 wherein said plurality of U-shaped channel members are made of polyethylene.

15. A module according to claim 11 wherein said second thermoplastic means is formed of a thermoplastic tape.

16. A module according to claim 11 wherein said substantially hermetic sealing means further comprises at least one L-shaped member for supporting at least one of said electrical conductors, said L-shaped support member being disposed between the periphery of one of said support sheets and said second thermoplastic means.

17. A module according to claim 11 comprising a thermoplastic tube heat-shrunk around one of said electrical conductors and fused to said sealing means.

18. A photovoltaic module comprising in combination:

first and second glass sheets disposed in substantially parallel spaced relationship to one another, said glass sheets having periphery-defining edges;

an array of electrically interconnected photovoltaic cells and a mass of an ionomer disposed in the space between said glass sheets, said photovoltaic cells being surrounded and encapsulated by said ionomer;

a plurality of ionomer sealing strips overlying and bonded to an outer surface of each of said first and second glass sheets adjacent said edges; and a plurality of high density polyethylene U-shaped channel members extending along and across said periphery-defining edges in overlapping relation with said ionomer sealing strips and said first and second glass sheets, said ionomer mass being bonded to said glass sheets, said cells and said channel members, said ionomer strips being bonded to said glass sheets and said channel members and also fused to said ionomer mass adjacent said edges, whereby the space between said first and second sheets is hermetically sealed.

19. A photovoltaic module comprising in combination:

first and second rectangular support sheets disposed in substantially parallel spaced relationship to one another, said first support sheet comprising a light transparent material and said second support sheet being made of a thermoplastic material and being formed so as to have a peripheral rim that overlaps the margin of said first sheet;

an array of electrically interconnected photovoltaic cells disposed in the space between said first and second sheets, each of said cells having a first light-receiving surface facing said first support sheet and a back surface facing said second support sheet;

a mass of an ionomer extending throughout said space in surrounding and encapsulating relation with said cells; and thermoplastic sealing means on the outwardly facing surface of said first sheet for sealing said peripheral rim to said outwardly facing surface;

said second sheet being made of polyethylene.

20. A module according to claim 19 wherein said thermoplastic sealing means comprises an ionomer.

21. A method of manufacturing a photovoltaic modules, comprising the steps of:

(a) providing one or more strings of electrically interconnected photovoltaic cells, each having a front light-receiving surface and a rear surface, with first and second electrical contacts attached to said front and rear surfaces, respectively;

(b) providing first and second sheets of glass, each having flat first and second opposite surfaces, a plurality of ionomer strips, first and second sheets of ionomer, and a plurality of U-shaped thermoplastic channel members;

(c) placing some of said ionomer strips on said first surface of said first sheet of glass along and adjacent the edges thereof;

(d) placing said first ionomer sheet in overlying relation with said second surface of said first sheet of glass;

(e) placing said one or more strings of cells in overlying relation with said first ionomer sheet;

(f) covering said one or more strings of cells with said second ionomer sheet;

(g) placing said second sheet of glass in overlying relation with said second ionomer sheet so that its said first surface engages said second ionomer sheet;

(h) placing others of said strips of ionomer on said second surface of said second sheet of glass along and adjacent the edges thereof;

(i) positioning said plurality of U-shaped thermoplastic channel members so that they overlap said ionomer strips and said first and second sheets of glass;

(j) heating the resulting assembly of cells, sheets, strips, and channels under vacuum and pressure so as to:
(1) cause said first and second ionomer sheets to soften enough to encapsulate said cells; and
(2) cause said plurality of ionomer strips to soften enough to wet said glass sheets and said plurality of U-shaped thermoplastic channel members; and (h) cooling said assembly so as to cause said ionomer sheets and strips to bond to said first and second glass sheets, said cells, and said plurality of U-shaped channel members.

22. A method of manufacturing a photovoltaic module, comprising the steps of:

(a) providing the following components: (1) one or more strings of electrically interconnected photovoltaic cells, each having a front light-receiving surface and a rear surface, with first and second electrical contacts attached to said front and rear surfaces, respectively, (2) a rectangular sheet of a light-transparent material having flat first and second opposite surfaces, (3) at least one ionomer strip, (4) first and second sheets of ionomer, and (5) a sheet of a thermoplastic material that is capable of bonding to ionomer under heat and pressure;

(b) assembling said components in overlying relation with one another so as to form an assembly comprising in order of position (1) said sheet of thermoplastic material, (2) said first ionomer sheet, (3) said cells, (4) said second ionomer sheet, (5) said sheet of light-transparent material, and (6) said strips of ionomer, with said ionomer strips overlying said first surface of said sheet of light-transparent material adjacent the edge thereof, and edge portions of said sheet of thermoplastic material overlying the edges of said ionomer strips; and (c) heating the resulting assembly under vacuum and pressure so as to (1) cause said first and second ionomer sheets to soften enough to flow around and encapsulate said cells; and (2) cause said at least one ionomer strips to soften enough to wet said sheet of light-transmitting material and said sheet of thermoplastic material; and (d) cooling said assembly so as to cause said ionomer sheets to bond to said cells and said sheets of light transparent material and thermoplastic material and also cause said at least one ionomer strip to bond to said sheet of light transparent material and said edge portions of said sheet of thermoplastic material.

* * * * *

UNITED STATES PATENT AND TRADEMARK OFFICE
CERTIFICATE OF CORRECTION

PATENT NO. : 5,733,382
DATED : March 31, 1998
INVENTOR(S) : Jack I. Hanoka

It is certified that error appears in the above-indentified patent and that said Letters Patent is hereby corrected as shown below:

Claim 4, column 12, line 63, the letter "I" should be changed to the numeral -- 1 --; and Claim 21, column 14, line 52, the word "modules" should be changed to -- module --.

Signed and Sealed this

Thirtieth Day of June, 1998

Attest:

BRUCE LEHMAN

Attesting Officer     Commissioner of Patents and Trademarks